United States Patent
Park

(10) Patent No.: US 10,901,547 B2
(45) Date of Patent: Jan. 26, 2021

(54) TOUCH SENSOR ASSEMBLY HAVING A PRESSING TAB, PIEZO DISC, AND OXIDATION PREVENTION FILM

(71) Applicant: LG ELECTRONICS INC., Seoul (KR)

(72) Inventor: Seungje Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 161 days.

(21) Appl. No.: 16/015,824

(22) Filed: Jun. 22, 2018

(65) Prior Publication Data

US 2018/0373375 A1    Dec. 27, 2018

(30) Foreign Application Priority Data

Jun. 23, 2017  (KR) .................... 10-2017-0079559

(51) Int. Cl.
*G06F 3/041* (2006.01)
*H03K 17/96* (2006.01)
(Continued)

(52) U.S. Cl.
CPC ............ *G06F 3/0414* (2013.01); *H01L 27/20* (2013.01); *H03K 17/964* (2013.01);
(Continued)

(58) Field of Classification Search
CPC ................ G06F 3/041; H03K 17/964–9643
See application file for complete search history.

(56) References Cited

U.S. PATENT DOCUMENTS 5,239,152 A * 8/1993 Caldwell .............. H01H 13/702
200/5 R
5,995,877 A * 11/1999 Brueggemann ......... F24C 7/082
700/83

(Continued)

FOREIGN PATENT DOCUMENTS

EP     0 525 374      2/1993
KR    10-1029044     5/2011
(Continued)

OTHER PUBLICATIONS

Korean Notice of Allowance dated Jan. 8, 2018 issued in Application No. 10-2017-0079559.
(Continued)

*Primary Examiner* — William Boddie
*Assistant Examiner* — Andrew B Schnirel
(74) *Attorney, Agent, or Firm* — KED & Associates LLP

(57) ABSTRACT

A touch sensor assembly includes a touch substrate attached to a rear surface of a panel having a touch point, a piezo disk having first and second poles stacked thereon, a pressing tab flexibly provided on the touch substrate, electrically connected to the first pole upon being in contact with the first pole, and electrically connected to a first wire provided on the touch substrate, a fixing surface electrically connected to the second pole while supporting the second pole such that the piezo disk is fixed to the rear surface of the touch substrate and electrically connected to a second wire provided on the touch substrate, and an oxidation prevention film coated on at least one of the first pole or the second pole of the piezo disk and the pressing part or the fixing surface of the touch substrate and made of a conductive material.

18 Claims, 11 Drawing Sheets

(51) Int. Cl.
*H01L 27/20* (2006.01)
*F25D 23/02* (2006.01)
*F25D 29/00* (2006.01)

(52) U.S. Cl.
CPC .......... *F25D 23/028* (2013.01); *F25D 29/005* (2013.01); *G06F 2203/04103* (2013.01)

(56) References Cited

U.S. PATENT DOCUMENTS

| | | | |
|---|---|---|---|
| 2009/0128375 A1* | 5/2009 | Heimann | H03K 17/9643 341/34 |
| 2010/0007531 A1* | 1/2010 | Fluhrer | H03K 17/964 341/34 |
| 2010/0149000 A1* | 6/2010 | Heimann | H03K 17/964 341/34 |
| 2014/0009035 A1* | 1/2014 | Toyoda | H01G 5/16 310/330 |
| 2016/0003519 A1* | 1/2016 | Kim | F25D 29/005 362/307 |
| 2016/0105985 A1* | 4/2016 | Wang | H05K 7/14 361/810 |
| 2016/0181379 A1* | 6/2016 | Akao | H01L 29/41741 257/331 |

FOREIGN PATENT DOCUMENTS

| | | |
|---|---|---|
| KR | 10-1521996 | 5/2015 |
| KR | 10-1659181 | 9/2016 |
| KR | 10-1659184 | 9/2016 |
| KR | 10-1668921 | 10/2016 |

OTHER PUBLICATIONS

European Search Report dated Nov. 7, 2018 issued in EP Application No. 18179455.3.

* cited by examiner

Fig.7
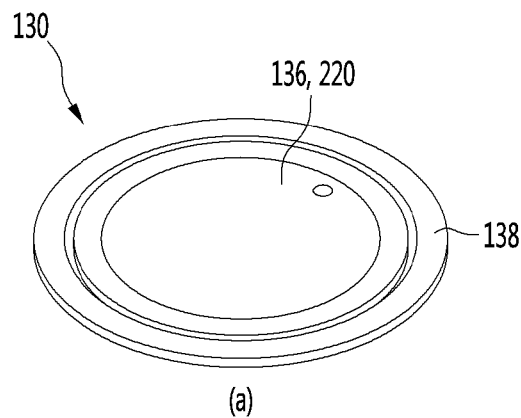
(a)
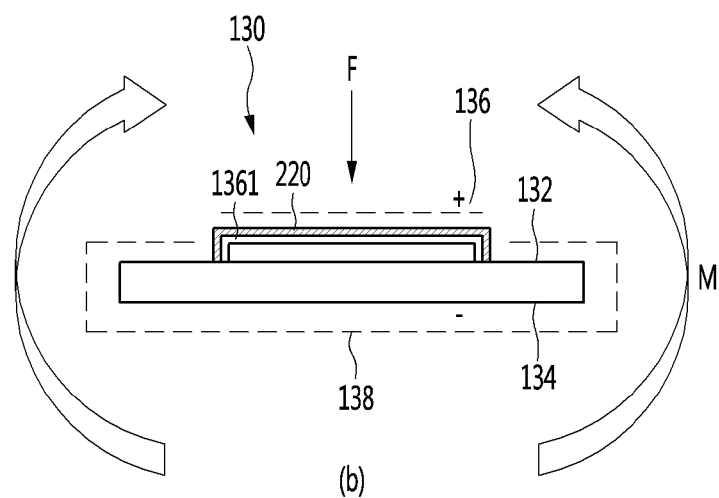
(b)

TOUCH SENSOR ASSEMBLY HAVING A PRESSING TAB, PIEZO DISC, AND OXIDATION PREVENTION FILM

CROSS-REFERENCE TO RELATED APPLICATION(S)

The present application claims priority under 35 U.S.C. 119 and 35 U.S.C. 365 to Korean Patent Application No. 10-2017-0079559, filed in Korea on Jun. 23, 2017, which is hereby incorporated by reference in its entirety.

BACKGROUND

1. Field

The present specification relates to a touch sensor assembly.

2. Background

Refrigerators may be classified into a top mount type refrigerator in which a freezing compartment is located above a refrigerating compartment, a bottom freezer type refrigerator in which a refrigerating compartment is located above a freezing compartment, and a side-by-side type refrigerator in which a refrigerating compartment and a freezing compartment are respectively located at left and right sides, according to the configurations of the refrigerating compartment and the freezing compartment, for example.

The side-by-side type refrigerator may be mainly used as a refrigerator having a relatively large capacity and various functions, and may include a freezing compartment and a refrigerating compartment which are vertically installed at the left and right sides of the refrigerator. An evaporator may be provided on the rear surface of the freezing compartment to suck air from the lower portions of the freezing compartment and the refrigerating compartment and to discharge air upward, thereby circulating cool air in the compartments to perform the refrigerating function and the freezing function.

Refrigerator doors may be rotatably installed on a front surface of a refrigerator and may be exposed to a user when storage compartments are closed. In consideration of the usage of the refrigerator, in which a time to keep the refrigerator door open is small during a day, the front surface of the door of the refrigerator may be decorated with a panel having various patterns or a front panel of the door may be made of a luxurious exterior material, in order to provide an aesthetically pleasing appearance.

Recently, users have shown a high preference for a material of home appliances made of metal. When a display for confirming operation information of a refrigerator and buttons for operating the refrigerator are installed on a front surface of a door of the refrigerator, the appearance of the refrigerator may be deteriorated.

In consideration of this, research into a door structure in which display information and buttons are not usually displayed and are displayed only when a user desires to view the display information and the buttons is actively being conducted. It may be difficult to apply an electrostatic touch method to a door having a front panel made of a metal material. In addition, since the metal material itself has certain rigidity, it may not be easy to implement a static-pressure type touch method. In particular, it may be difficult to implement a hidden button on a panel made of a metal material using a conventional touch sensing method.

Accordingly, there is a need to develop a sensor capable of reliably recognizing a touch operation even in a panel made of a metal material. Such a sensor may be applicable not only to a front panel of a refrigerator door but also to various home appliances having a metal panel and capable of applying a hidden button for performing a touch operation to the metal panel and thus may be widely used in various fields.

In the above-described metal touch sensor, when metal connectors are exposed to air for a long time, oxidation may occur, resulting in an abnormal electrical connection of the connectors. In order to prevent such oxidation, a sealing structure may be formed such that the connectors are not exposed to air.

However, such a sealing structure is complicated and a process of manufacturing the same is complicated, thereby decreasing productivity of the metal touch sensor. In addition, the sealing structure increases the size of the metal touch sensor and increases manufacturing costs.

BRIEF DESCRIPTION OF THE DRAWINGS

Embodiments will be described in detail with reference to the following drawings in which like reference numerals refer to like elements, and wherein:

FIG. 7 is an enlarged view and a side view of a portion B which is one of the piezo disks shown in FIG. 4;

DETAILED DESCRIPTION

Figure 1:
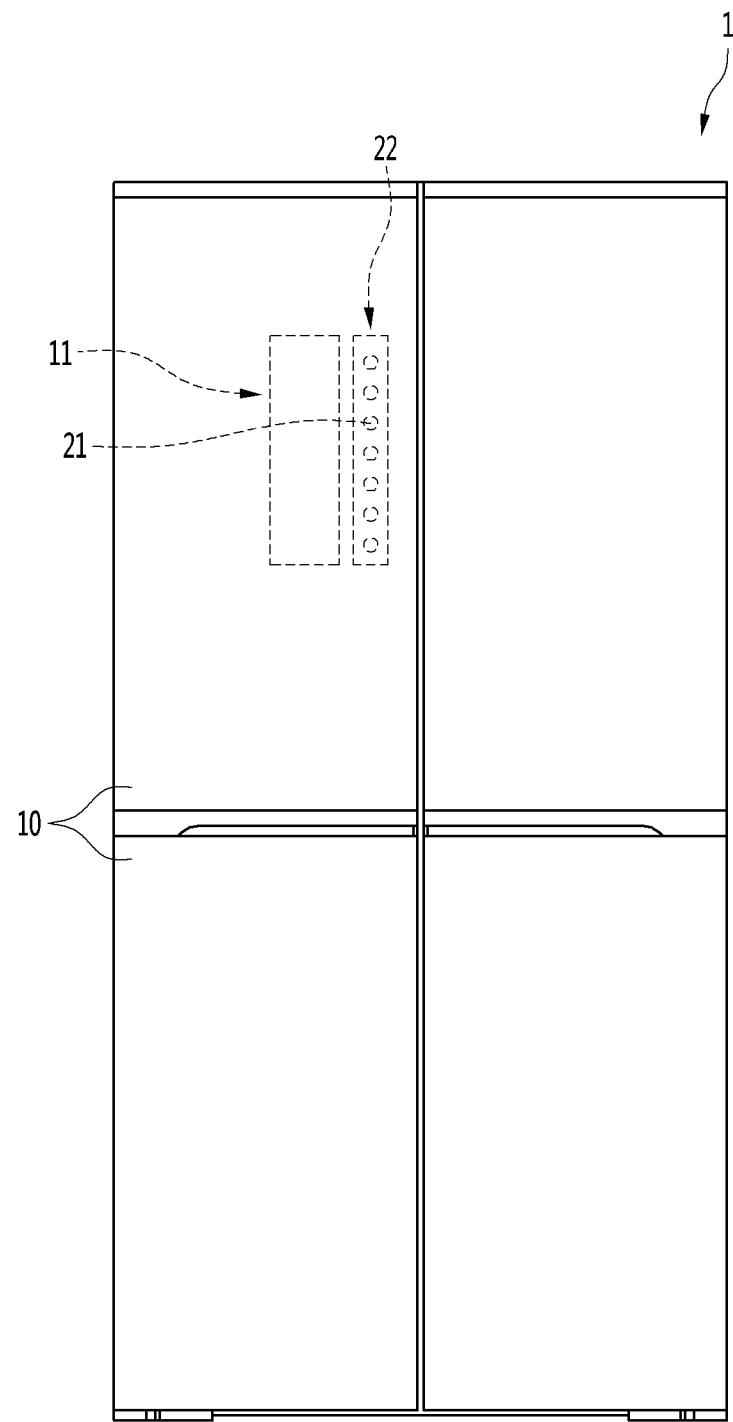
FIG. 1 illustrates a front surface of a refrigerator, to which a touch sensor assembly is applied.
Figure 2:
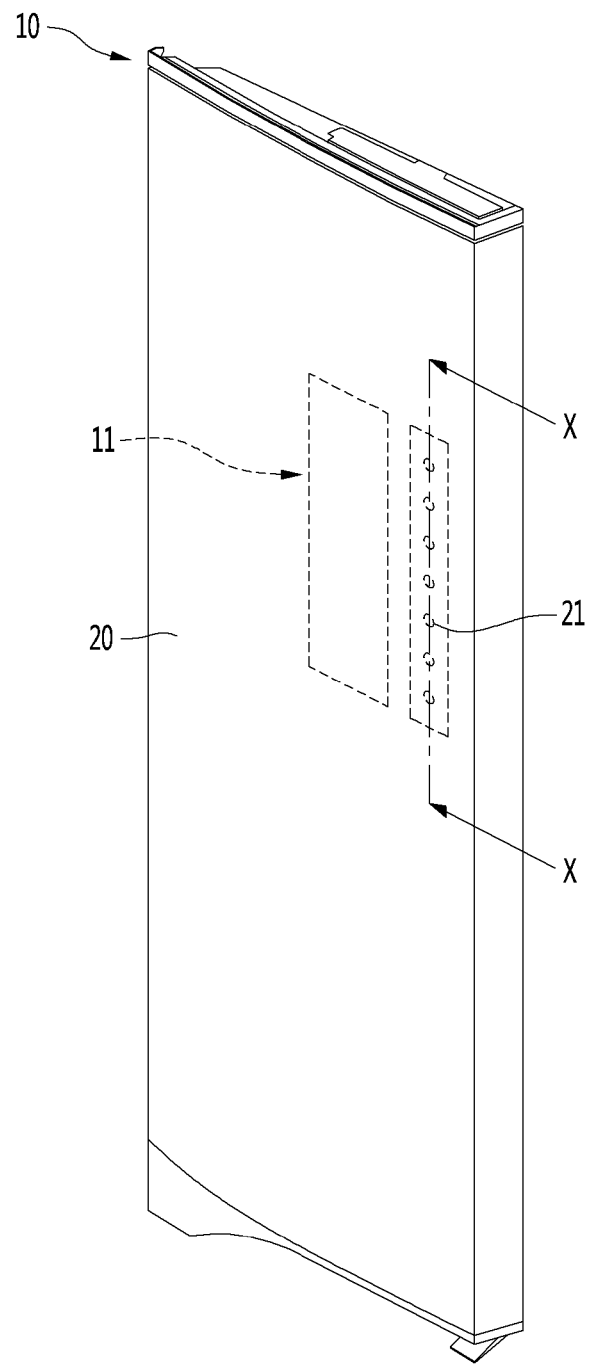
FIG. 2 is a perspective view showing a door portion of the refrigerator of FIG. 1.
Figure 3:
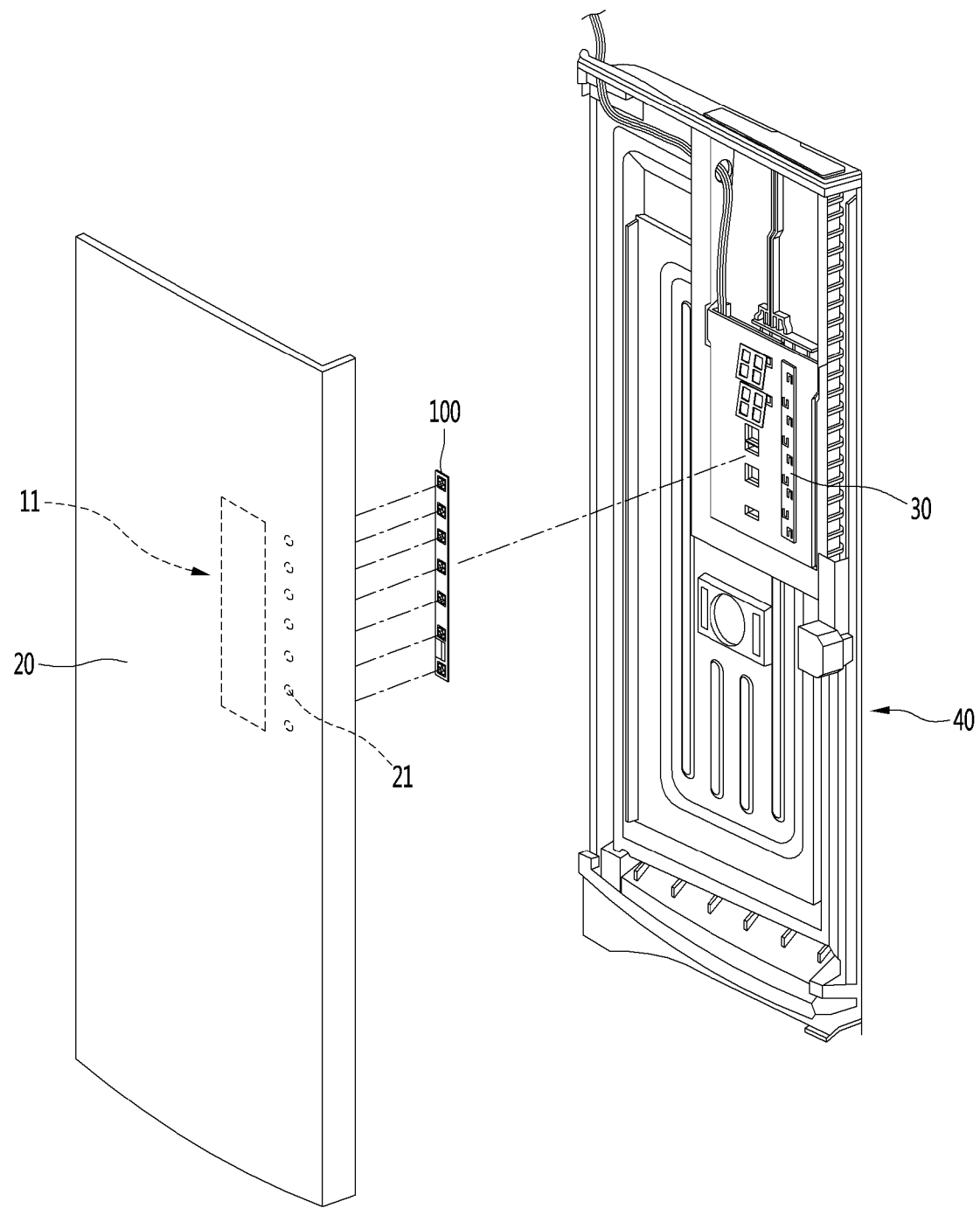
FIG. 3 is a partial exploded perspective view of the refrigerator of FIG. 2.

FIG. 1 illustrates a front surface of a refrigerator, to which a touch sensor assembly is applied, FIG. 2 is a perspective view showing a door portion of the refrigerator of FIG. 1, and FIG. 3 is a partial exploded perspective view of the refrigerator of FIG. 2. As shown in FIG. 1, the appearance of the refrigerator 1 according to an embodiment may be defined by a cabinet that provides a storage space and refrigerator doors 10 installed on the cabinet to open and close the storage space. The storage space provided by the cabinet may be partitioned into left and right sides and/or upper and lower sides, and a plurality of refrigerator doors 10 for opening and closing the storage space is provided on a front surface of the partitioned storage space. The doors 10 may open and close the storage space in a sliding or rotation manner and the doors configure the front appearance of the refrigerator in a state of closing the doors.

On a door 10, which corresponds to an eye level of a user having an average height, of the plurality of refrigerator doors 10, a display region 11 and a touch region 22 may be provided at a height where a user can easily identify or operate the regions. The display region 11 may display the operation state of the refrigerator 1 to the outside and may display symbols or numerals as light irradiated from an internal space of the door 10 is transmitted (see FIG. 2), such that the user can check the operation information of the refrigerator.

When light is not irradiated from the internal space of the door, the display region 11 may not be displayed (see FIG. 1). In this state, the display region 11 may not be visible in the door 10, thereby implementing a clear appearance.

The touch region 22 may be used for a user to perform a touch operation for operating the refrigerator 1 and may be provided near the display region 11. A plurality of touch points 21 may be provided in the touch region 22. When the user presses a touch point 21, an operation corresponding thereto may be performed. The touch points 21 may be displayed to be recognized by the user by a printing process or a surface processing method such as etching.

Of course, the touch region 22 may not be installed on the same door 10 as the display region 11 and may be installed on another door 10 or on one side of a cabinet. In addition, the touch points 21 may not be displayed so as to be always identified and the positions thereof may or may not be recognized depending on whether light is irradiated from the inside of the door or not, as in the display region 11.

A front panel 20 may be made of a metal plate such as a steel or stainless steel plate. A touch sensor assembly 100 may be fixed to a rear surface of a portion corresponding to the touch region 22 of the front panel 20. A support structure (or support) 30 may be installed inside a door liner 40 fastened to the rear side of the front panel 20, in order to increase adhesive strength between the touch sensor assembly 100 and the front panel 20. When the front panel 20 and the door liner 40 are fastened in a state of fixing the touch sensor assembly 100 to the rear surface of the front panel 20, the support structure 30 installed on the door liner 40 may press the rear surface of the touch sensor assembly 100 to support the touch sensor assembly 100 forward.

In addition, by fastening the front panel 20 and the door liner 40 when the touch sensor assembly 100 is fixed to the front surface of the support structure 30, the front surface of the touch sensor assembly 100 may be adhered to the rear surface of the front panel 20. In addition, it should be understood that various supporting methods including a method of assembling the front panel 20 and the door liner 40 to support the touch sensor assembly 100 toward the front panel 20 are possible.

Figure 4:
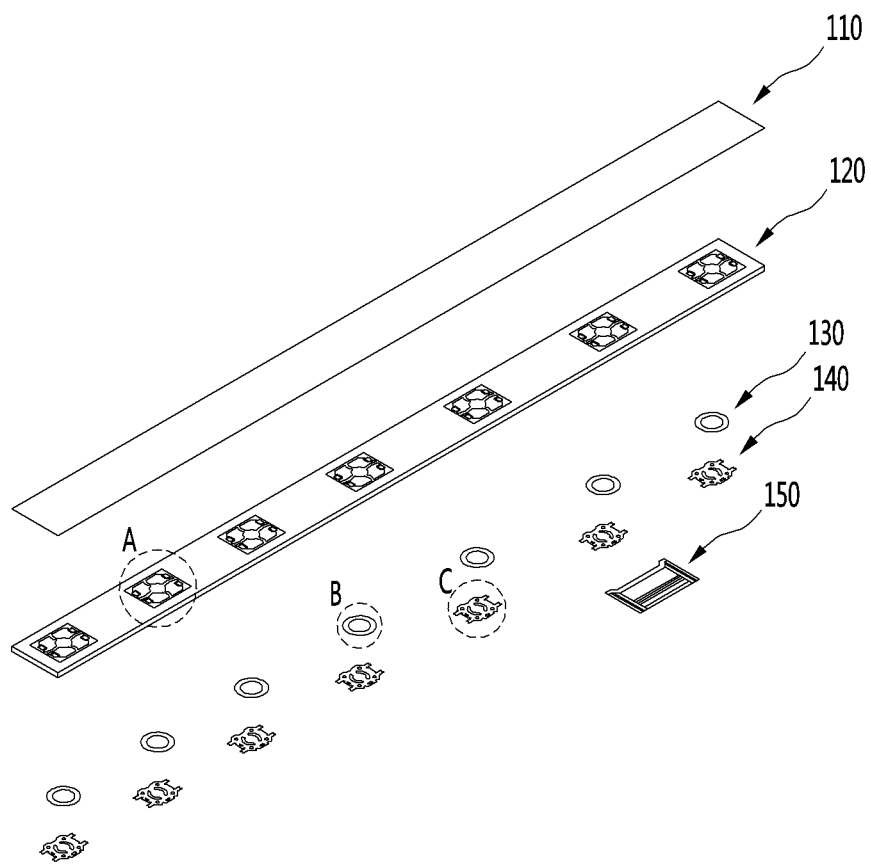
FIG. 4 is an exploded perspective view of the touch sensor assembly shown in FIG. 3.
Figure 5:
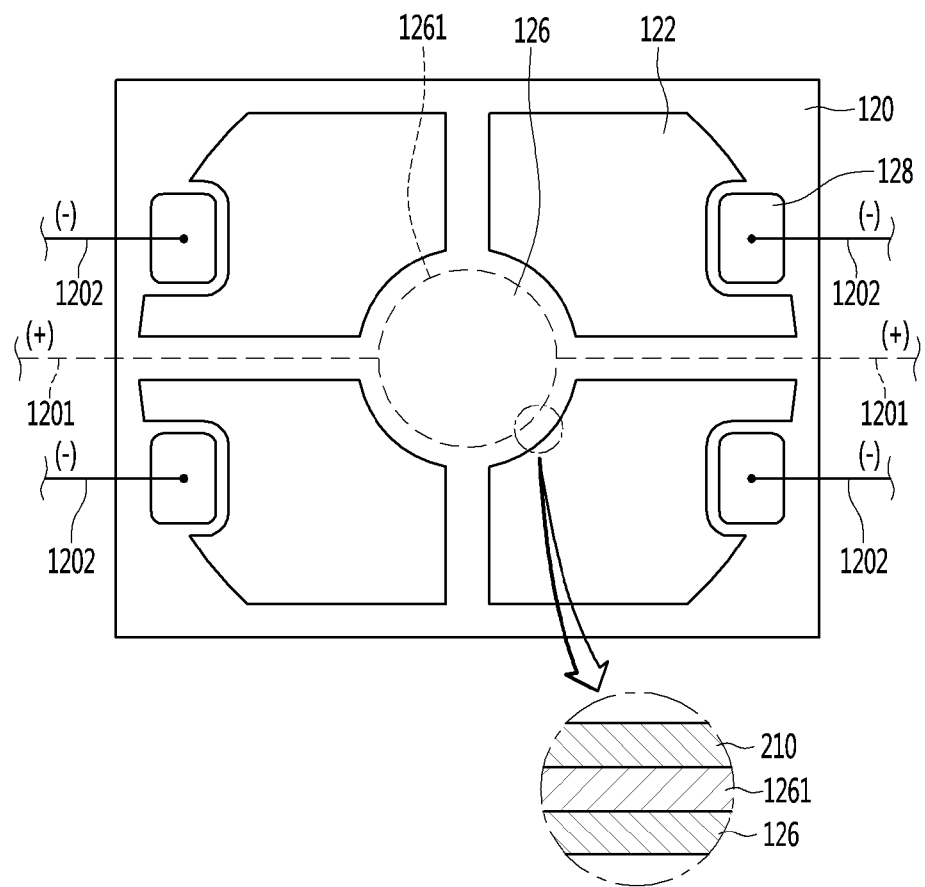
FIG. 5 is an enlarged view of a portion A of the touch substrate shown in FIG. 4.
Figure 6:
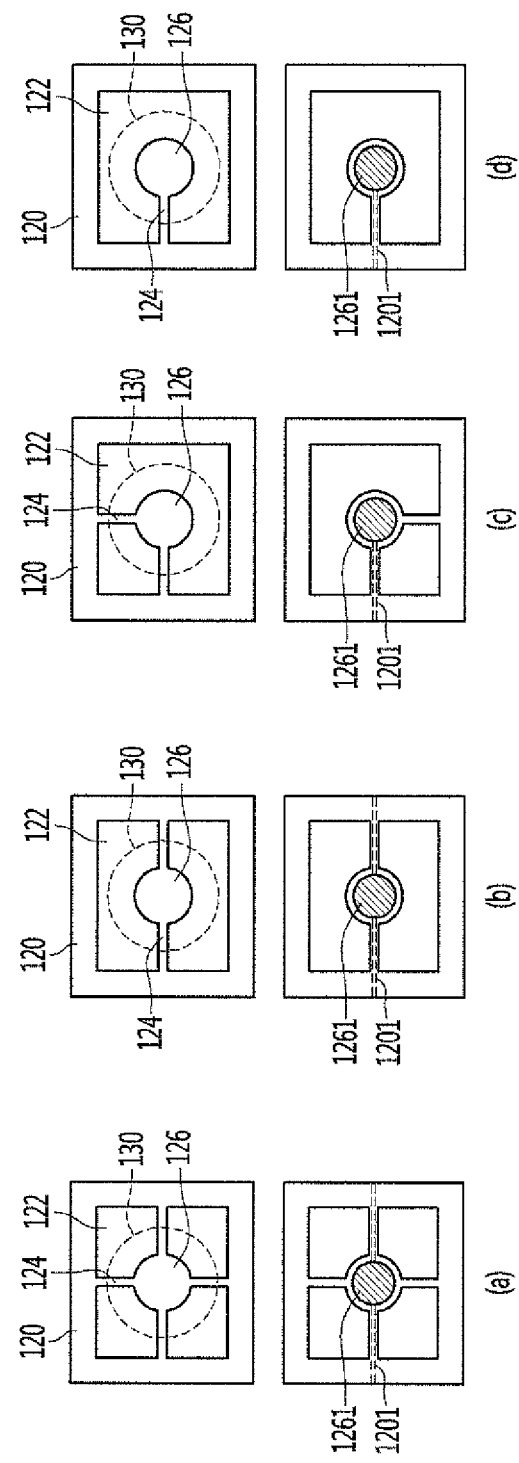
FIG. 6 is a front view and a rear view showing the other embodiments of the portion of the touch substrate shown in FIG. 5.
Figure 8:
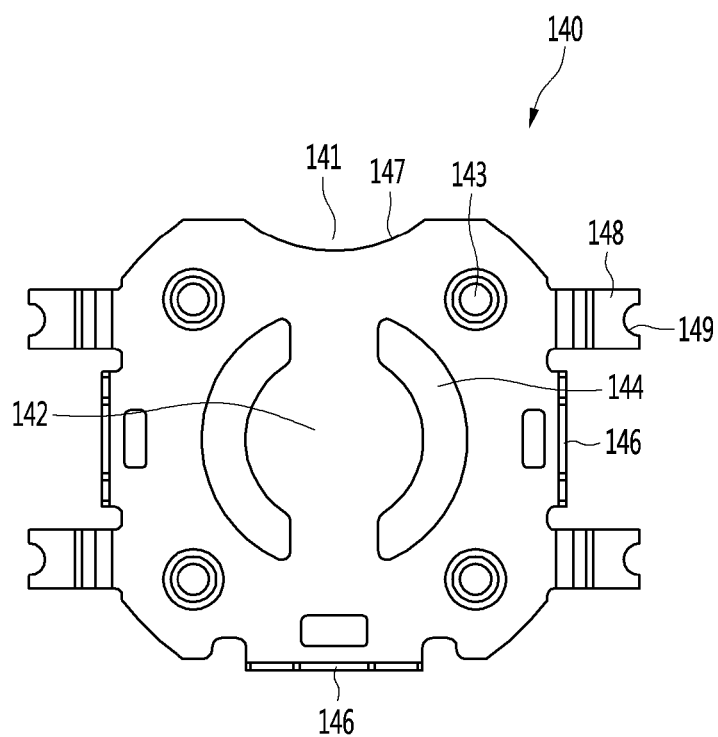
FIG. 8 is an enlarged view of a portion C which is one of holders shown in FIG. 4.
Figure 9:
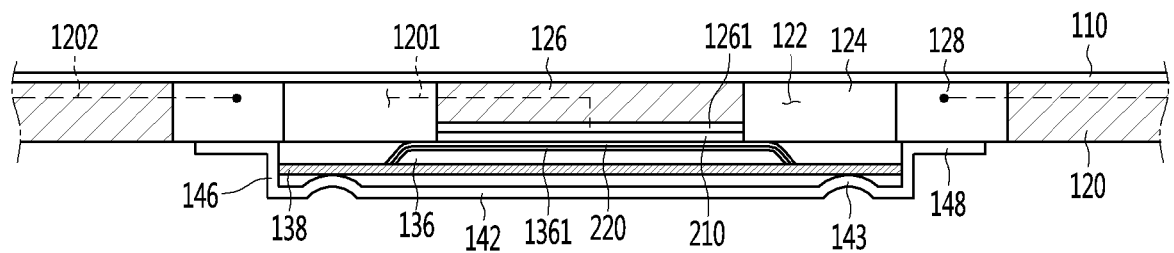
FIG. 9 is a cross-sectional view of a piezo disk installation portion of the touch sensor assembly when viewed in an X-X direction of FIG. 2 in a state of assembling the touch sensor assembly of FIG. 4.
Figure 10:
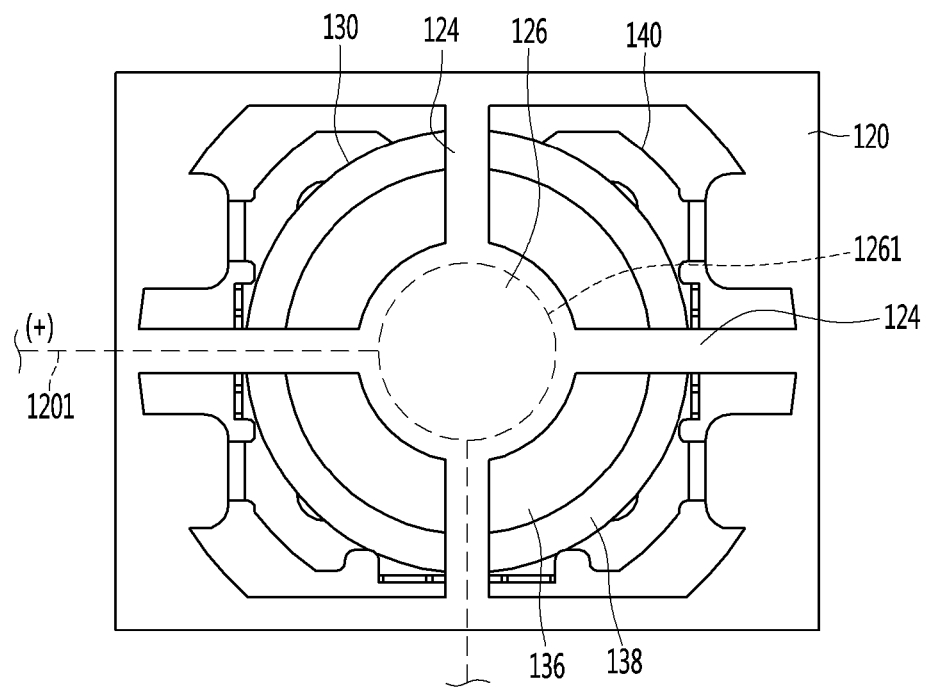
FIG. 10 is a front view showing a state in which the touch substrate, the holder and the piezo disk of the touch sensor assembly of FIG. 4 are assembled.
Figure 11:
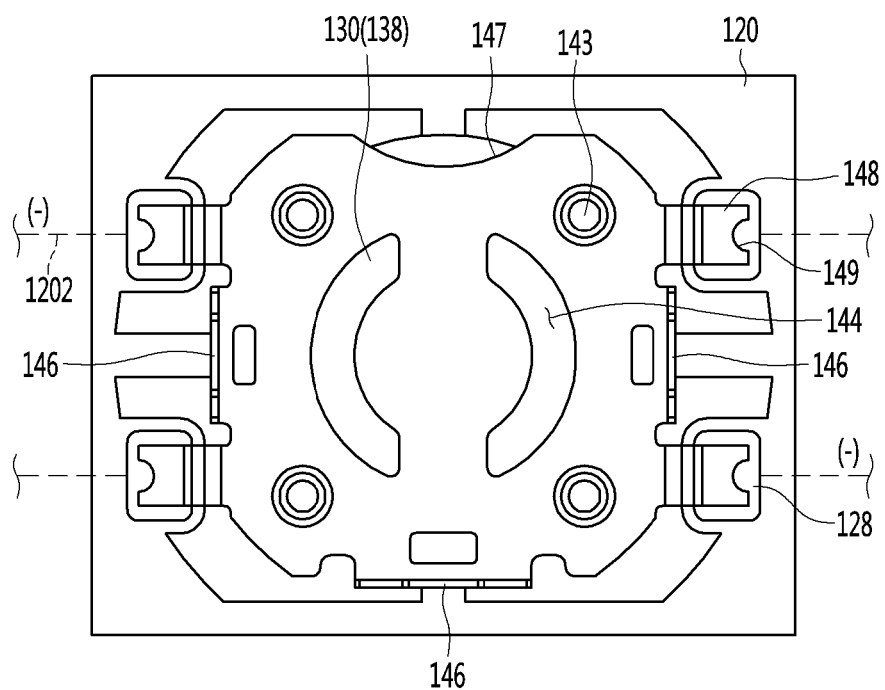
FIG. 11 is a rear view of FIG. 10.

FIG. 4 is an exploded perspective view of the touch sensor assembly shown in FIG. 3, FIG. 5 is an enlarged view of a portion A of the touch substrate shown in FIG. 4, FIG. 6 is a front view and a rear view showing the other embodiments of the portion of the touch substrate shown in FIG. 5, FIG. 7 is an enlarged view and a side view of a portion B which is one of the piezo disks shown in FIG. 4, FIG. 8 is an enlarged view of a portion C which is one of holders shown in FIG. 4, FIG. 9 is a cross-sectional view of a piezo disk installation portion of the touch sensor assembly when viewed in an X-X direction of FIG. 2 in a state of assembling the touch sensor assembly of FIG. 4, FIG. 10 is a front view showing a state in which the touch substrate, the holder and the piezo disk of the touch sensor assembly of FIG. 4 are assembled, and FIG. 11 is a rear view of FIG. 10. Hereinafter, the overall structure of the touch sensor assembly and the structures of the individual components configuring the touch sensor assembly will be described in detail with reference to FIGS. 4 to 11.

Referring to FIGS. 4 and 9, the touch sensor assembly 100 may include a touch substrate 120 and a piezo disk 130. The touch substrate 120 may be made of a printed circuit board (PCB) having a certain thickness.

A first adhesive member 110 such as a double-sided adhesive tape may be adhered to an outer surface, that is, the opposite surface of the surface on which the piezo disk is provided, of the touch substrate 120 to be water-tight with respect to the touch substrate 120 and the structure stacked thereon and the outer surface of the touch substrate 120 may be attached to the rear surface of the front panel 20 of the refrigerator door. A second adhesive member may be attached to the touch substrate 120, the piezo disk 130 and the outer surface, that is, the opposite surface of the surface on which the touch substrate 120 is stacked, of a holder 140 to be water-tight with respect to the touch substrate 120, the piezo disk 130 and the holder 140.

The touch substrate 120 may correspond to the touch region 22 including the plurality of touch points 21 provided on the front panel 20 configuring the door 10 of the refrigerator 1. In an embodiment, the plurality of touch points 21 may be arranged on the front panel 20 to be spaced apart from each other in a line and the touch region 22 may be formed in an elongated rectangular shape (see FIGS. 1 to 3). Accordingly, the touch substrate 120 may be formed in an elongated rectangular shape.

Referring to FIG. 5, a hole 122 may be provided in the touch substrate 120 at a position corresponding to the touch point 21 of the front panel 20. In the embodiment, the hole may be substantially rectangular but the shape of the hole is not limited thereto. The center of the hole 122 may be aligned with the center of the touch point 21 of the front panel 20.

A leg part (or leg) 124 extending from an inner circumferential surface to the center of the hole 122 may be provided in the inner circumferential surface of the hole 122. A pressing part or tab 126 aligned with the center of the hole may be connected to the front ends of the leg parts 124.

The shape of the pressing part 126 may correspond to that of the piezo disk 130 and the size thereof may be slightly less than that of the piezo disk 130. The piezo disk 130 and the circular pressing part 126 corresponding thereto are shown. The pressing part 126 and the inner circumferential surface of the hole 122 having a rectangular shape may be connected to each other by the leg part 124 extending from the center of each side of the rectangle to the pressing part 126.

The structure in which the hole 122 is provided in the touch substrate 120 and the pressing part 126 provided at the center of the hole is connected by the leg part 124 may make the pressing part 126 flexible. That is, when the user presses the touch point 21 of the front panel, the pressing force may be applied to the pressing part 126. Since the pressing part 126 is connected to the main body of the touch substrate 120 through the plurality of relatively thin leg part 124, the pressing part 126 may be pressed by the pressing force of the user.

Accordingly, the structure in which the pressing part 126 is provided at the center of the hole 122 through the four leg parts 124 may be variously changed if the pressing part 126 is easily moved according to the touch pressure of the user and may have sufficient durability against repeated pressing operations. As a modification of the embodiment (see FIGS.

5 and 6(a)) in which the four leg parts are provided at an interval of 90°, a beam structure in which the leg parts are provided at an interval of 180° as shown in (b) of FIG. 6, a cantilever structure in which only two leg parts are provided at an interval of 90° as shown in (c) of FIG. 6 or a cantilever structure in which only one leg part is provided as shown in (d) of FIG. 6 may be applicable. In particular, since the cantilever structure is deformed so as to be more conformable to the touch pressure of the user, it may be possible to further increase touch sensitivity.

As shown in FIG. 5, fixing surfaces (or fixing portions) 128 which fix the fixing leg parts 148 of the holder 140 may be provided in the vicinity of the hole 122. Although the fixing surfaces 128 protruding toward the inside of the hole 122 in a substantially rectangular shape are provided in the embodiment, the positions of the fixing surfaces is not limited thereto.

Since the touch substrate 120 according to the first embodiment is formed in an elongated rectangular shape and the long side of the hole 122 having the rectangular shape is aligned in a direction corresponding to the longitudinal direction of the touch substrate, the touch substrate 120 may become slimmer. In addition, since the fixing surfaces 128 are provided at the short sides of the hole 122, an insertion hole 141 of the holder 140 may be opened toward the side surface of the touch substrate 120 and thus the piezo disk 130 may be more easily inserted.

The hole 122, the leg part 124, the pressing part 126, and the fixing surface 128 may be simultaneously formed in the touch substrate 120, by punching the hole portion of the touch substrate except for the leg parts 124, the pressing part 126 and the fixing surface 128. The touch substrate 120 may include electrical wirings, one of which is a first wiring or wire 1201 that passes through the pressing part 126 and the leg part 124 and the other of which is a second wiring or wire 1202 connected to the fixing surface 128, in order to determine whether pressure is applied to the piezo disk. That is, when pressure is applied to the piezo disk to generate a potential difference, electromotive force may be sensed through the wirings.

Referring to FIGS. 4, 8 and 9, the holder 140 may be fixed to the portion of the hole 122 of the touch substrate 120. When the holder 140 is fixed to the touch substrate 120, the piezo disk may be inserted into and fixed in a space provided by the holder and the touch substrate.

The holder 140 may include a rear support part (or rear support) 142 substantially covering the portion of the hole 122 of the touch substrate and having a rectangular shape. For reference, although the shape of the rear support part 142 may be substantially square, for convenience, the shape of the rear support part 142 is described as being a rectangular shape in correspondence with the rectangular hole 122 of the touch substrate 120. When the holder is fixed to the touch substrate, the rear support part 142 may be spaced apart from the surface of the touch substrate by a predetermined gap.

The gap between the rear support part 142 and the surface of the touch substrate may be defined by side support parts 146 bent on the outer edge of the rear support part at a substantially right angle. Fixing leg parts (or fixing tabs) 148 fixed to the fixing surfaces 128 of the touch substrate 120 through soldering may be provided on the ends of the side support parts 146. The fixing leg parts 148 may be electrically connected to the fixing surfaces 128 through soldering.

In some the embodiments, a total of four fixing surfaces 128 of the touch substrate may be provided at the short side portions of the rectangular hole 122 and four fixing leg parts 148 may be provided at positions corresponding to the fixing surfaces. Each fixing leg part 148 may be formed in a planar shape to be in contact with the fixing surface 128, and a via hole 149 may be formed in an end of the fixing leg part in order to increase soldering adhesion with the fixing surface 128. The fixing leg parts 148 may be arranged in the longitudinal direction of the touch substrate 120, such that the insertion hole 141 of the holder is opened toward the lateral side (that is, the direction perpendicular to the longitudinal direction) of the touch substrate 120, thereby more easily inserting the piezo disk.

The side support parts 146 may be bent at a right angle on two short sides and one long side among the four sides of the rectangular rear support part 142. The side support parts 146 may prevent the piezo disk 130 from being separated from the holder 140 in a process of supporting and assembling the side surface of the piezo disk 130 to be inserted into the holder 140. The fixing leg parts 148 may be provided at the portions of the side support parts 146 where the two short sides of the rear support part 142 are bent. The long side, on which the side support part 146 is not provided, of the rear support part 142 may become the insertion hole 141, through which the piezo disk 130 is inserted. An arc-shaped guide groove 147 that guides the end of the disk toward the insertion hole 141 upon inserting the piezo disk 130 having the circular plate may be provided in the long side portion, which may become the insertion hole 141, of the side support part 146.

The rear support part 142 may become a portion that supports the rear surface 134 of the piezo disk 130. Pressing projections 143 pressing and supporting the edges of the rear surface of the piezo disk 130 may be provided in the vicinities of the outer edges of the rear support part 142. The pressing projections 143 may be provided at positions deviating from a first pole 136 provided on the front surface of the piezo disk 130.

The portion of the first pole 136 provided at the central part of the front surface 132 of the piezo disk 130 may slightly protrude from the front surface of the piezo disk. Such a first pole portion may be in contact with the pressing part 126 of the touch substrate and may be pressed and supported by the touch substrate. Accordingly, when the pressing projections 143 are provided at the positions deviating from the first pole 136 provided on the front surface of the piezo disk 130, the pressing part 126, which may be flexibly moved by the leg parts 124 of the touch substrate 120 to some extent, may press the first pole 136 protruding from the front surface 132 of the piezo disk 130 and the pressing projections 143 of the holder 140 may press the edges of the rear surface 134 of the piezo disk 130 deviating from the first pole 136, thereby tightly supporting the piezo disk 130 while minimizing the load applied to a portion where the potential difference of the piezo disk 130 is generated.

In addition, slits 144 having an arc shape may be provided around the central point of the rear support part 142 of the holder. Such slits 144 may be provided inside the pressing projections 143. The slits 144 may facilitate deformation of the vicinities of the slits. Accordingly, the central portion of the rear support part may be deformed according to deformation of the central portion of the rear surface of the piezo disk 130 which may be finely bent toward the rear surface by the pressing part 126 and the pressing projections 143. The same may be true even when the user presses the touch point 21 of the front panel.

The holder 140 may be made of a conductive material such as metal, and a planar metal plate may be subjected to press processing or piercing to easily form the pressing projections, the slits, the side support part, etc. The holder 140 may be electrically connected to the second wirings 1202 through the fixing surface 128.

Referring to FIG. 7, the piezo disk 130 may include a second pole 138 of a metal plate having a front surface 132 and a rear surface 134 and a first pole 136 stacked on the central portion of the front surface 132. The first pole 136 may slightly protrude from the surface of the second pole 138 at a central portion thereof. The first pole 136 may be made of ceramic and the second pole 138 may be made of a conductive material such as metal. In addition, a conductive layer 1361 such as silver (Ag) may be coated on the surface of the first pole 136.

The piezo disk 130 may be a circular plate and the diameter thereof may be equal to or slightly less than a gap between the two side support parts where the two short sides of the rear support part of the holder are bent. The piezo disk 130 may be inserted between the touch substrate 120 and the holder 140 fixed to the touch substrate 120 and the guide groove 147 may guide insertion of the piezo disk 130 upon inserting the piezo disk. When the piezo disk 130 is inserted, the front surface 132, on which the first pole 136 is provided, may face the touch substrate 120 and the rear surface 134 may face the holder.

When pressure is applied between the first pole and the second pole of the piezo disk 130, a potential difference may be generated between the first pole and the second pole. According to the principle of the piezo disk 130, the wiring surface of the pressing part 126 of the touch substrate 120 which is in contact with the first pole 136 of the front surface 132 may be exposed to be electrically connected to the first pole, and the wirings 1201 may not be exposed so as not to be energized even when the leg part 124 of the touch substrate 120 is in contact with the second pole 138.

In addition, the wiring surface of the pressing part 126 may include a connection material or layer 1261 made of copper or gold and the plurality of first wirings 1201 may be electrically connected to the connection material 1261. The holder 140 may be made of a metal material having electrical conductivity and may be electrically connected to the second pole 138 of the rear surface 134. The first wirings 1201 of the pressing part 126 may be connected to the touch substrate 120 through the leg parts 124 to be connected to the wafer 150 and the fixing surface 128 of the touch substrate soldered to the fixing leg parts 148 of the holder 140 may be connected to the touch substrate 120 through the second wirings 1202 to be connected to the wafer 150.

Accordingly, when the user presses the touch point 21, the pressing part 126 may be pressed with predetermined force F to press the piezo disk 130. At this time, since the pressing part 126 presses the central portion of the front surface 132 of the piezo disk and the pressing projections 143 of the holder 140 supports the edges of the rear surface 134 of the disk, the piezo disk 130 may be deformed by the moment M and a potential difference may be generated between the first pole 136 and the second pole 138. Minute current according to electromotive force generated by this process may be transmitted through the wirings of the touch substrate and the wafer 150 to recognize that the touch point 21 is touched. Here, the connection material exposed to the pressing part 126 and the conductive layer 1361 coated on the surface of the first pole 136 may be corroded over time.

For example, the connection material 1261 made of copper (Cu) may be formed on the pressing part 126 and the conductive layer 1361 made of silver (Ag) may be formed in the first pole 136 made of ceramic. When the connection material 1261 and the conductive layer 1361 are exposed to air for a long time, oxidation may occur, resulting in an abnormal electrical connection of the connection material 1261 and the conductive layer 1361.

In order to prevent such oxidation, a sealing structure may be formed such that the touch substrate 120 and the piezo disk 130 are not exposed to air. However, such a sealing structure may be complicated and a process of manufacturing the same may be complicated, thereby decreasing productivity of the touch sensor assembly. In addition, such a sealing structure may increase the size of the touch sensor assembly 100 and increase manufacturing costs.

In order to prevent such oxidation, oxidation prevention films 210 and 220 may be formed on the exposed surfaces of the connection material 1261 and the conductive layer 1361. For example, the oxidation prevention films 210 and 220 may be provided by coating a conductive material, which is not oxidized, on the exposed surfaces of the connection material 1261 and the conductive layer 1361. Specifically, the oxidation prevention films 210 and 220 may be formed by coating a carbon or metal on the exposed surfaces of the connection material 1261 and the conductive layer 1361 using a silk screen method.

Carbon, gold, etc. are not oxidized by air or water and are positive conductors of electricity. Accordingly, the connection material 1261 and the conductive layer 1361 may be energized by the oxidation prevention films 210 and 220 and the exposed surfaces of the connection material 1261 and the conductive layer 1361 may be prevented from being oxidized.

In addition, the oxidization prevention films 210 and 220 may be formed on at least one surface of the first pole 136 or the second pole 138 of the piezo disk 130 and the pressing part 126 or the fixing surface 128 of the touch substrate 120 and may be formed of various materials having conductivity while preventing oxidation. In addition, the oxidation prevention films 210 and 220 may be formed in the connection regions of the piezo disk 130 and the touch substrate 120 using various methods.

When the oxidation prevention films 210 and 220 are formed as described above, it may be possible to prevent oxidation of the piezo disk 130 and the touch substrate 120 without the conventional complicated sealing structure. In addition, it may be possible to prevent electrical contact failure due to oxidation of the piezo disk 130 and the touch substrate 120. In addition, by removing the sealing structure, it may be possible to reduce a cost and to increase productivity.

A plurality of piezo disks may be installed on the touch substrate. The wafer 150 for electrical connection with the piezo disk of the touch sensor assembly may be provided outside the touch sensor assembly.

Referring to FIG. 4, the wafer 150 may be installed on the touch substrate 120. According to the embodiments, the wafer 150 may be installed in a space between the holes of the touch substrate 120 on which the piezo disks 130 are installed and may be installed on the same surfaces as the surface, on which the holders 140 are fixed, of the touch substrate.

Hereinafter, an example of the order of assembling the touch sensor assembly will be described with reference to FIGS. 4 to 9. First, the holder 140 may be soldered and fixed to the rear surface (the opposite surface of the surface facing the front panel) of the touch substrate 120. Then, the wafer 150 may be installed by an automated process.

Next, the piezo disk 130 may be inserted between the holder 140 and the touch substrate 120. Since insertion of the piezo disk is guided by the guide groove 147 when the piezo disk 130 is inserted, it may be possible to more easily insert the piezo disk. In addition, since the piezo disk 130 is circular but the side surface support 146 of the holder 140 substantially corresponds to the side of the rectangle, when only an end of the piezo disk 130 is inserted into the insertion part and the piezo disk is pressed from behind, the circular edge of the piezo disk 130 may guide the piezo disk 130 such that the piezo disk is naturally aligned and inserted into the holder.

In particular, according to the embodiments, since the touch substrate 120 has an elongated rectangular shape, the long sides of the rectangular holes 122 may be aligned in a direction corresponding to the longitudinal direction of the touch substrate, and the insertion parts of the holders 140 may be provided in correspondence with the long sides of the holes, it may be possible to insert the piezo disks 130 into the holders 140 at the side surface of the touch substrate 120. Therefore, insertion is more easily performed.

The front surface and the rear surface of the touch portions of the touch sensor assembly in a semi-assembled state in which the holder 140 is fixed to the touch substrate 120 and the piezo disk 130 is inserted are shown in FIGS. 10 and 11, respectively. Next, a second adhesive member may be stacked on the rear surface of the holder 140 and the touch substrate 120. This may be performed through an automated process. The first adhesive member 110 may be stacked in a state of attaching a release paper to the surface thereof and removing the release paper when the touch sensor assembly 100 is attached to the front panel 20 of the refrigerator door 10, thereby preventing the adhesive strength of the surface of the first adhesive member 110 from being deteriorated.

In the above-described embodiments, the structure of the touch sensor assembly of the refrigerator and the method of manufacturing the same have been described. However, the above-described touch sensor assembly is applicable to various fields such as vehicle door panels, including the other types of home appliances, in addition to the refrigerator.

An object of the present invention is to provide a touch sensor assembly having a small number of parts, a simple manufacturing method and high touch operation sensing reliability. Another object of the present invention is to provide a touch sensor assembly capable of preventing oxidation of a piezo disk and a touch substrate without a complicated sealing structure.

Another object of the present invention is to provide a touch sensor assembly capable of preventing electrical contact failure due to oxidation of a piezo disk and a touch substrate. Another object of the present invention is to provide a touch sensor assembly capable of reducing a cost and improving productivity by removing a sealing structure.

Another object of the present invention is to provide a touch sensor assembly having high touch operation sensitivity. Another object of the present invention is to provide a touch sensor assembly having robustness and high durability.

Another object of the present invention is to provide a touch sensor assembly having a high degree of freedom in design. Another object of the present invention is to provide a touch sensor assembly which can be easily and manually manufactured and can be automated. Another object of the present invention is to provide a touch sensor assembly which can be robustly assembled and can increase touch operation sensing reliability.

A touch sensor assembly may include a touch substrate attached to a rear surface of a panel having a touch point, a piezo disk having first and second poles stacked thereon, wherein the first pole is disposed on at least a central portion of a front surface thereof and aligned in a direction facing the touch substrate to be fixed to a rear surface of the touch substrate, a pressing part flexibly provided on the touch substrate, electrically connected to the first pole upon being in contact with the first pole, and electrically connected to a wiring provided on the touch substrate, a fixing surface electrically connected to the second pole while supporting the second pole such that the piezo disk is fixed to the rear surface of the touch substrate and electrically connected to second wirings provided on the touch substrate, and an oxidation prevention film coated on at least one of the first pole or the second pole of the piezo disk and the pressing part or the fixing surface of the touch substrate and made of a conductive material. Accordingly, it is possible to prevent oxidation of the piezo disk and the touch substrate without a complicated sealing structure and to prevent electrical contact failure due to oxidation of the piezo disk and the touch substrate.

In addition, the oxidation prevention film may be made of carbon or gold (Au). In addition, the oxidation prevention film may be coated using a silk screen method. In addition, a hole may be provided at a position of the touch substrate corresponding to the touch point, and the pressing part may be connected to a leg part extending from an inner circumferential surface of the hole to a central portion of the hole.

In addition, he first wiring may be electrically connected to the pressing part through the leg part. In addition, the leg part may be radially provided around the pressing part. In addition, a holder for providing fixing force for fixing the piezo disk to the rear surface of the touch substrate by supporting a side surface and a rear surface of the piezo disk may be fixed to the fixing surface.

In addition, the holder may be made of a conductive material, and the second pole of the piezo disk may be electrically connected to the fixing surface. In addition, the holder may include a rear support part supporting a rear surface of the piezo disk, a side support part extending from an edge of the rear support part toward the touch substrate to support the side surface of the piezo disk, and a fixing leg part extending from the side support part outwardly in a direction parallel to a plane including the touch substrate to be fixed to the fixing surface of the touch substrate.

In addition, an insertion hole opened to insert the piezo disk may be formed in one side of the rear support part. In addition, a guide groove recessed inward may be provided in an edge of the rear support part including the insertion hole in order to guide insertion of the piezo disk.

In addition, pressing projections protruding forwardly to press the rear surface of the piezo disk forwardly may be provided on the rear support part, and the pressing projections may press edges of the rear surface of the piezo disk. A first adhesive member for providing adhesive strength to adhere the touch substrate to the rear surface of the panel may be stacked on a front surface of the touch substrate.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch sensor assembly, comprising:
   a touch substrate attached to a rear surface of a panel, the panel having a touch point;
   a piezo disk having a first pole having a first charge and a second pole having a second charge different from the first charge stacked thereon, the first pole provided on at least a central portion of a front surface of the piezo disk and fixed to a rear surface of the touch substrate;
   a pressing tab flexibly provided on the touch substrate, configured to be electrically connected to the first pole upon contact with the first pole based on receiving an input at the touch point, and electrically connected to a first wire provided on the touch substrate;
   a fixing portion electrically connected to the second pole while supporting the second pole such that the piezo disk is fixed to the rear surface of the touch substrate and is electrically connected to a second wire provided on the touch substrate; and
   a first oxidation prevention film and a second oxidation prevention film, the first and second oxidation prevention films including a conductive material formed in electrical connection regions of the piezo disk and the touch substrate,
   wherein the pressing tab and the first pole face each other, the first oxidation prevention film is coated on a surface of the first pole that faces the pressing tab, and the second oxidation prevention film is coated on a surface of the pressing tab that faces the first pole.

2. The touch sensor assembly according to claim 1, wherein the first and second oxidation prevention films are made of carbon or gold (Au).

3. The touch sensor assembly according to claim 1, wherein a hole is provided at a position of the touch substrate corresponding to the touch point, and wherein the pressing tab is connected to at least one leg that extends from an inner circumferential surface of the hole to a central portion of the hole.

4. The touch sensor assembly according to claim 3, wherein the first wire is electrically connected to the pressing tab through the at least one leg.

5. The touch sensor assembly according to claim 3, wherein the at least one leg is radially provided around the pressing tab.

6. The touch sensor assembly according to claim 3, wherein the at least one leg has an asymmetric structure with respect to the pressing tab.

7. The touch sensor assembly according to claim 1, further comprising a holder that fixes the piezo disk to a rear surface of the touch substrate by supporting a side surface and a rear surface of the piezo disk, wherein the holder is fixed to the fixing portion.

8. The touch sensor assembly according to claim 7, wherein the holder is made of a conductive material, and wherein the second pole of the piezo disk is electrically connected to the fixing portion.

9. The touch sensor assembly according to claim 7, wherein the holder includes:
   a rear support that supports a rear surface of the piezo disk;
   a side support that extends from an edge of the rear support toward the touch substrate to support a side surface of the piezo disk; and
   a fixing leg that extends from the side support outwardly in a direction parallel to a plane including the touch substrate to be fixed to the fixing portion of the touch substrate.

10. The touch sensor assembly according to claim 9, wherein the rear support includes an insertion hole into which the piezo disk is inserted, the insertion hole being formed at one side of the rear support.

11. The touch sensor assembly according to claim 10, wherein the rear support further includes a guide groove recessed inward from an edge of the rear support to guide insertion of the piezo disk.

12. The touch sensor assembly according to claim 10, wherein the insertion hole is formed toward an outside of the touch substrate.

13. The touch sensor assembly according to claim 9, wherein the rear support further includes pressing projections that protrude toward the touch substrate to press the rear surface of the piezo disk toward the touch substrate, and wherein the pressing projections press edges of the rear surface of the piezo disk.

14. The touch sensor assembly according to claim 9, wherein slits are formed around a center of the rear support.

15. The touch sensor assembly according to claim 1, further including a first adhesive member that adheres the touch substrate to the rear surface of the panel, wherein the first adhesive member is stacked on a front surface of the touch substrate.

16. A touch sensor assembly, comprising:
   a panel having a front, a rear opposite to the front, and a touch point;
   a touch substrate adhered to the rear of the panel, the touch substrate formed with a pressing tab provided behind the touch point and configured to be flexible in a front-rear direction;
   a first pole provided at a rear of the pressing tab and configured to be electrically connected to the pressing tab when the pressing tab moves rearward to contact the first pole based on receiving an input at the touch point;
   a second pole provided at a rear of the first pole;
   a holder including a rear support, a fixing leg, and a side support connecting the rear support to the fixing leg, the fixing leg being coupled to the rear of the touch substrate and the first and second poles being provided between the rear support and the pressing tab; and
   wherein the pressing tab and the first pole face each other, and
   wherein a first oxidation prevention film is coated on a surface of the first pole that faces the pressing tab, a second oxidation prevention film is coated on a surface of the pressing tab that faces the first pole, and the first and second oxidation prevention films include a conductive material formed in electrical connection regions of the first pole and the pressing tab.

17. The touch sensor assembly of claim 16, further comprising:
   a connection layer including at least one of carbon or gold and provided between the pressing tab and the second oxidation prevention layer;
   a fixing leg coupled to the side support
   a first wire electrically connected to the pressing surface and the connection layer; and
   a second wire electrically connected to the touch substrate and the fixing leg.

18. The touch sensor assembly of claim 16, wherein:
   the panel includes a plurality of touch points;
   the touch substrate includes a plurality of pressing tabs provided behind the touch points, respectively;
   a plurality of piezo discs, each having the first and second poles, are provided at a rear of the plurality of pressing tabs, respectively; and
   a plurality of holders are provided behind the second poles of the plurality of piezo discs, respectively.

* * * * *